United States Patent
Matsuno et al.

(10) Patent No.: US 10,424,367 B2
(45) Date of Patent: *Sep. 24, 2019

(54) METHOD AND APPARATUS FOR DECODING COMMAND OPERATIONS FOR A SEMICONDUCTOR DEVICE

(71) Applicant: Micron Technology, Inc., Boise, ID (US)

(72) Inventors: Hiroyuki Matsuno, Tokyo (JP); Koji Mine, Tokyo (JP); Yoshifumi Mochida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/841,131

(22) Filed: Dec. 13, 2017

(65) Prior Publication Data

US 2018/0108396 A1   Apr. 19, 2018

Related U.S. Application Data

(62) Division of application No. 14/887,217, filed on Oct. 19, 2015, now Pat. No. 9,865,324.

(51) Int. Cl.
| G11C 11/4076 | (2006.01) |
| G11C 11/408 | (2006.01) |
| G11C 11/4096 | (2006.01) |
| G11C 11/4094 | (2006.01) |
| G11C 7/10 | (2006.01) |
| G11C 8/12 | (2006.01) |

(52) U.S. Cl.
CPC .......... *G11C 11/4076* (2013.01); *G11C 7/109* (2013.01); *G11C 7/1039* (2013.01); *G11C 8/12* (2013.01); *G11C 11/4087* (2013.01); *G11C 11/4094* (2013.01); *G11C 11/4096* (2013.01)

(58) Field of Classification Search
None
See application file for complete search history.

(56) References Cited

U.S. PATENT DOCUMENTS

| 9,865,324 | B2 | 1/2018 | Matsuno et al. |
| 2011/0164460 | A1 | 7/2011 | Kajigaya et al. |
| 2011/0283060 | A1 | 11/2011 | Ware et al. |
| 2013/0032950 | A1 | 2/2013 | Ware et al. |

(Continued)

OTHER PUBLICATIONS

"Low Power Double Data Rate 4 (LPDDR4)", JEDEC Solid State Technology Association; Aug. 2014, 196 pages.

*Primary Examiner* — J. H. Hur
(74) *Attorney, Agent, or Firm* — Dorsey & Whitney LLP

(57) ABSTRACT

Method and Apparatuses for of decoding commands for a semiconductor device are described. An example method includes receiving a portion of a command at first and second clock cycles; validating the portion of the command received at the first and second clock cycles at a third clock cycle when a chip select signal indicates a first state and continuing to receive the remaining portion of the command at the third clock cycle and a fourth clock cycle so that the command can be completely received by the semiconductor device by the fourth clock cycle; and invalidating the portion of the command received at the first and second clock cycles at the third clock cycle when the chip select signal indicates a second state different from the first state, so that a new command can be input to the semiconductor device at the third clock cycle.

18 Claims, 14 Drawing Sheets

| Command | CKE (n-1) | CKE (n) | CS | CA0 | CA1 | CA2 | CA3 | CA4 | CA5 | CK Edge | |
|---|---|---|---|---|---|---|---|---|---|---|---|
| Deselect | H | H | L | X | X | X | X | X | X | 1 | |
| MRW | H | H | H | L | H | H | L | L | V | 1 | |
| | | | L | MA0 | MA1 | MA2 | MA3 | MA4 | MA5 | 2 | 4 Cycles |
| | | | (L) | V | V | V | V | OP6 | OP7 | 3 | |
| | | | L | OP0 | OP1 | OP2 | OP3 | OP4 | OP5 | 4 | |
| MRR | H | H | H | L | H | H | H | L | V | 1 | |
| | | | L | MA0 | MA1 | MA2 | MA3 | MA4 | MA5 | 2 | 4 Cycles |
| | | | (L) | V | V | V | V | V | V | 3 | |
| | | | L | V | V | V | V | V | V | 4 | |
| ACT | H | H | H | H | L | R12 | R13 | R14 | R15 | 1 | |
| | | | L | BA0 | BA1 | BA2 | V | R10 | R11 | 2 | 4 Cycles |
| | | | (L) | V | V | R6 | R7 | R8 | R9 | 3 | |
| | | | L | R0 | R1 | R2 | R3 | R4 | R5 | 4 | |
| WRT | H | H | H | L | L | H | L | L | BL | 1 | |
| | | | L | BA0 | BA1 | BA2 | V | V | AP | 2 | 4 Cycles |
| | | | (L) | V | V | V | V | C8 | C9 | 3 | |
| | | | L | C2 | C3 | C4 | C5 | C6 | C7 | 4 | |
| READ | H | H | H | L | H | L | L | L | BL | 1 | |
| | | | L | BA0 | BA1 | BA2 | V | V | AP | 2 | 4 Cycles |
| | | | (L) | V | V | V | V | C8 | C9 | 3 | |
| | | | L | C2 | C3 | C4 | C5 | C6 | C7 | 4 | |
| PRECHARGE | H | H | H | H | H | H | L | H | AB | 1 | |
| | | | L | BA0 | BA1 | BA2 | V | V | V | 2 | |

(56) References Cited

U.S. PATENT DOCUMENTS

2014/0181333 A1 6/2014 Bains
2015/0089164 A1 3/2015 Ware et al.
2015/0098287 A1 4/2015 Lee
2015/0317096 A1 11/2015 Bains
2017/0110173 A1 4/2017 Matsuno

| Command | CKE (n-1) | CKE (n) | CS | CA0 | CA1 | CA2 | CA3 | CA4 | CA5 | CK Edge |
|---|---|---|---|---|---|---|---|---|---|---|
| Deselect | H | H | L | X | X | X | X | X | X | 1 |
| MRW | H | H | H | L | H | H | L | L | V | 1 |
|  |  |  | L | MA0 | MA1 | MA2 | MA3 | MA4 | MA5 | 2 |
|  |  |  | L | V | OP1 | OP2 | V | OP6 | OP7 | 3 |
|  |  |  | L | OP0 | OP1 | OP2 | OP3 | OP4 | OP5 | 4 |
| MRR | H | H | H | L | H | H | H | L | V | 1 |
|  |  |  | L | MA0 | MA1 | MA2 | MA3 | MA4 | MA5 | 2 |
|  |  |  | L | V | V | V | V | V | V | 3 |
|  |  |  | L | V | V | V | V | V | V | 4 |
| ACT | H | H | H | H | L | R12 | R13 | R14 | R15 | 1 |
|  |  |  | L | BA0 | BA1 | BA2 | V | R10 | R11 | 2 |
|  |  |  | L | V | V | R6 | R7 | R8 | R9 | 3 |
|  |  |  | L | R0 | R1 | R2 | R3 | R4 | R5 | 4 |
| WRT | H | H | H | L | H | H | L | L | BL | 1 |
|  |  |  | L | BA0 | BA1 | BA2 | V | V | AP | 2 |
|  |  |  | L | V | V | V | V | C8 | C9 | 3 |
|  |  |  | L | C2 | C3 | C4 | C5 | C6 | C7 | 4 |
| READ | H | H | H | L | H | H | L | L | BL | 1 |
|  |  |  | L | BA0 | BA1 | BA2 | V | V | AP | 2 |
|  |  |  | L | V | V | V | V | C8 | C9 | 3 |
|  |  |  | L | C2 | C3 | C4 | C5 | C6 | C7 | 4 |
| PRECHARGE | H | H | H | H | H | H | L | H | AB | 1 |
|  |  |  | L | BA0 | BA1 | BA2 | V | V | V | 2 |

FIG. 3

| Command | CKE (n-1) | CKE (n) | CS | CA0 | CA1 | CA2 | CA3 | CA4 | CA5 | CK Edge |
|---|---|---|---|---|---|---|---|---|---|---|
| DESELECT | H | H | L | X | X | X | X | X | X | 1 |
| MRW | H | H | H | H | H | L | L | L | L | 1 |
|  |  |  | L | MA0 | MA1 | MA2 | MA3 | MA4 | MA5 | 2 |
|  |  |  | L | > | > | > | > | OP6 | OP7 | 3 |
|  |  |  | L | OP0 | OP1 | OP2 | OP3 | OP4 | OP5 | 4 |
| MRR | H | H | H | L | H | H | L | L | L | 1 |
|  |  |  | L | > | > | > | > | > | > | 2 |
|  |  |  | L | > | > | > | > | > | > | 3 |
|  |  |  | L | MA0 | MA1 | MA2 | MA3 | MA4 | MA5 | 4 |
| ACT | H | H | H | H | L | BA2 | R13 | R14 | R15 | 1 |
|  |  |  | L | BA0 | BA1 | R12 | R9 | R10 | R11 | 2 |
|  |  |  | L | > | > | > | R6 | R7 | R8 | 3 |
|  |  |  | L | (L) | > | > | R6 | R7 | R8 | 3' |
|  |  |  | L | R0 | R1 | R2 | R3 | R4 | R5 | 4 |
| WRT | H | H | H | L | L | H | L | L | > | 1 |
|  |  |  | L | BA0 | BA1 | BA2 | C5 | C6 | C7 | 2 |
|  |  |  | L | C2 | C3 | C4 | > | > | > | 3 |
|  |  |  | L | > | > | > | C8 | C9 | AP | 4 |
| READ | H | H | H | L | L | L | L | H | > | 1 |
|  |  |  | L | BA0 | BA1 | BA2 | C5 | C6 | C7 | 2 |
|  |  |  | L | C2 | C3 | C4 | > | > | > | 3 |
|  |  |  | L | > | > | > | C8 | C9 | AP | 4 |
| PRECHARGE | H | H | H | H | H | H | L | H | AB | 1 |
|  |  |  | L | BA0 | BA1 | BA2 | > | > | > | 2 |

*FIG. 6*

| Command | CKE (n-1) | CKE (n) | CS | CA0 | CA1 | CA2 | CA3 | CA4 | CA5 | CK Edge |
|---|---|---|---|---|---|---|---|---|---|---|
| DESELECT | H | H | L | X | X | X | X | X | X | 1 |
| MRW | H | H | H | H | H | L | L | L | L | 1 |
|  |  |  | L | MA0 | MA1 | MA2 | MA3 | MA4 | MA5 | 2 |
|  |  |  | L | V | V | V | V | OP6 | OP7 | 3 |
|  |  |  | L | OP0 | OP1 | OP2 | OP3 | OP4 | OP5 | 4 |
| MRR | H | H | H | H | H | L | H | L | L | 1 |
|  |  |  | L | MA0 | MA1 | MA2 | MA3 | MA4 | MA5 | 2 |
|  |  |  | L | V | V | V | V | V | V | 3 |
|  |  |  | L | V | V | V | V | V | V | 4 |
| ACT | H | H | H | H | L | R12 | R13 | R14 | R15 | 1 |
|  |  |  | L | BA0 | BA1 | BA2 | R9 | R10 | R11 | 2 |
|  |  |  | (L) | V | V | V | R6 | R7 | R8 | 3 |
|  |  |  | H | R0 | R1 | R2 | R6 | R7 | R8 | 3' |
|  |  |  | L | R0 | R1 | R2 | R3 | R4 | R5 | 4 |
| WRT | H | H | H | L | L | H | H | L | V | 1 |
|  |  |  | L | BA0 | BA1 | BA2 | C5 | C6 | V | 2 |
|  |  |  | L | C2 | C3 | C4 | C5 | C6 | C7 | 3 |
|  |  |  | L | V | V | V | V | V | AP | 4 |
| READ | H | H | H | L | L | H | H | L | V | 1 |
|  |  |  | L | BA0 | BA1 | BA2 | C5 | C6 | V | 2 |
|  |  |  | L | C2 | C3 | C4 | C5 | C6 | C7 | 3 |
|  |  |  | L | V | V | V | V | V | AP | 4 |
| PRECHARGE | H | H | H | L | H | L | V | V | V | 1 |
|  |  |  | L | V | V | V | V | V | V | 2 |
|  |  |  | (L) | V | V | V | V | V | AB | 3 |
|  |  |  | H | V | V | V | V | V | AB | 3' |
|  |  |  | L | BA0 | BA1 | BA2 | V | V | V | 4 |

FIG. 10

METHOD AND APPARATUS FOR DECODING COMMAND OPERATIONS FOR A SEMICONDUCTOR DEVICE

CROSS REFRENCE TO RELATED APPLICATION(S)

This application is a divisional of U.S. patent application Ser. No. 14/887,217 filed Oct. 19, 2015 and issued as U.S. Pat. No. 9,865,324 on Jan. 9, 2018. The aforementioned application, and issued patent, is incorporated herein by reference, in its entirety for any purpose.

BACKGROUND

High data reliability, high speed of memory access, and reduced chip size are features that are demanded from semiconductor memory.

In recent years, there has been an effort to reduce chip size while reducing power consumption and increasing access speed for mobile devices. As part of that effort to reduce chip size, it may be desirable to reduce a number of signal lines between dynamic random access memory (DRAM) and a controller. Along these lines, commands to the DRAM may be provided from a reduced number of address pins by dividing information of a single clock cycle into a plurality of clock cycles alternating signals in synchronization with rising and falling edges of a clock signal. For example, it has been proposed that a number of pins for command/address (CA) bus in a high-speed synchronous dynamic random access memory (SDRAM) like Low Power Double Data Rate 4 (LPDDR4) be reduced to 6-bit per die while increasing two channels per die. Thus, a total of twelve CA pins may be used for communicated with the memory. In a particular example, LPDDR4 receives a command with two or four clock cycles at six CA pins of CA0-CA5 in a CA bus. Each command in the LPDDR4 devices typically uses four clock cycles in order to transfer command, address and bank information.

JEDEC Standard No. 209-4 shows command structure in a command truth table (Table 63) and describes that a four-cycle command may be generated from two consecutive two-cycle sub commands. In this case, a two-cycle command irrelevant to the first sub command may be received. As a result, more command codes are needed to distinguish sub commands, including the first sub command and the second sub commands, thus the number of CA pins for command decoding would be increased. Moreover, four clock cycles are used for one command, and consequently, less number of commands can be conveyed during a predetermined number of clock cycles.

BRIEF DESCRIPTION OF THE DRAWINGS

FIG. 3 is a command truth table of various combinations of command signals for command operations for a semiconductor device, according to an embodiment of the present disclosure.

FIG. 6 is a command truth table of various combinations of command signals for a semiconductor device, according to an embodiment of the present disclosure.

FIG. 10 is a command truth table of various combinations of command signals for a semiconductor device, according to an embodiment of the present disclosure.

DETAILED DESCRIPTION OF PREFERRED EMBODIMENTS

Reduced chip size, lowered power consumption and high speed of memory access are features demanded from semiconductor memory for mobile devices. Reducing a number of pins in a command/address (CA) bus may be effective approach to lower power consumption and reduce chip size. The reduced number of the CA pins however may cause more clock cycles for transmitting commands and addresses to the semiconductor memory. Furthermore, the reduced number of the CA pins tends to result in more command codes to distinguish between commands, and thus consumes more information bits of CA.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
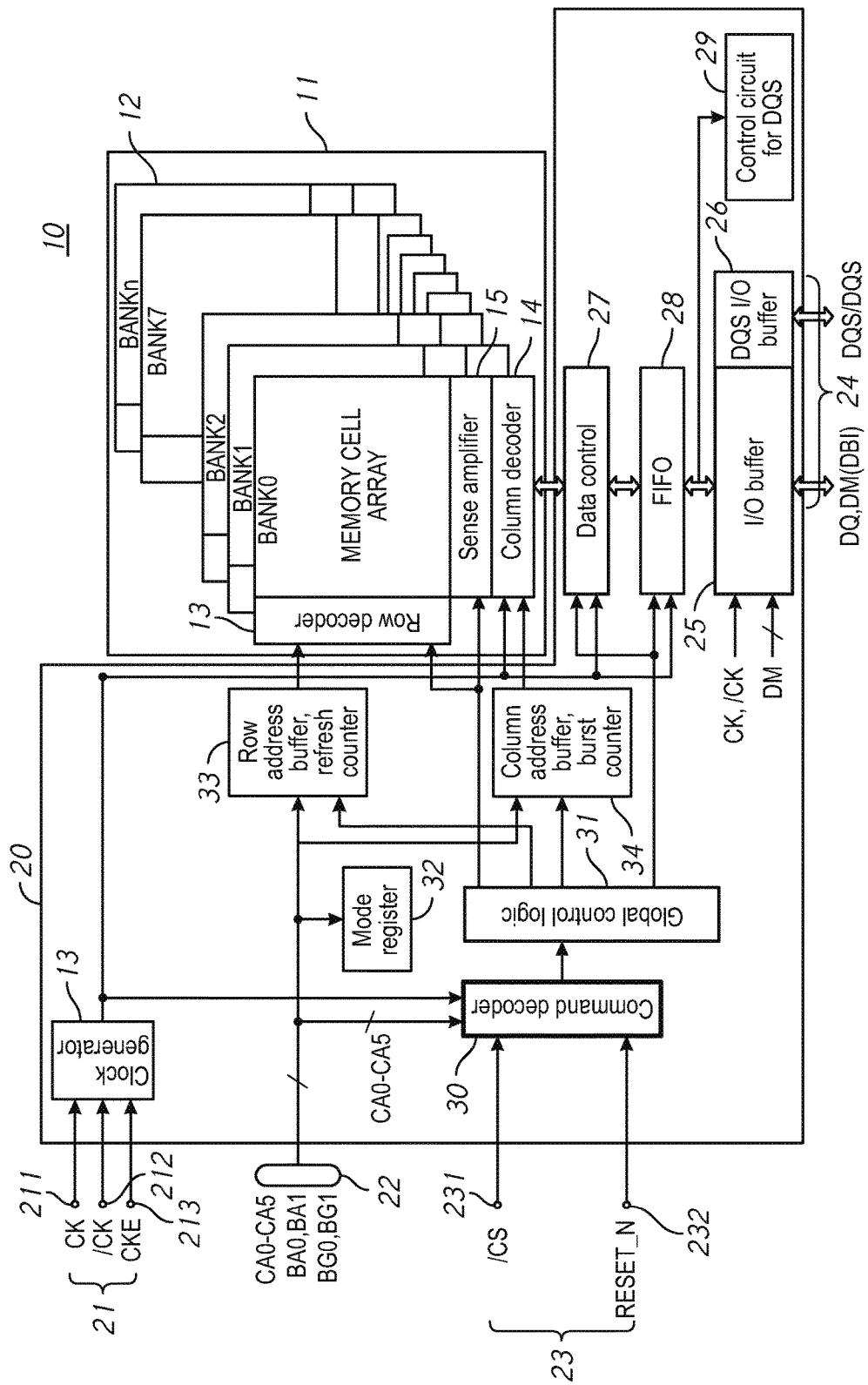
FIG. 1 is a block diagram of a semiconductor device in accordance with the present disclosure.

FIG. 1 is a block diagram of a semiconductor device in accordance with the present disclosure. The semiconductor device 10 may be a LPDDR4 SDRAM integrated into a single semiconductor chip, for example, however, other devices may also be the semiconductor device 10 of the present disclosure. The semiconductor device 10 may be mounted on a memory module substrate, a mother board or the like (not shown). The semiconductor device 10 includes a memory cell array region 11 and a peripheral circuit region 20. The memory cell array region 11 includes a memory cell array 12 including a plurality of banks, each bank including a plurality of word lines, a plurality of bit lines, and a plurality of memory cells arranged at intersections of the plurality of word lines and the plurality of bit lines. The selection of the word line is performed by a plurality of row decoders 13 and the selection of the bit line is performed by a plurality of column decoders 14. Sense amplifiers 15 are located for their corresponding bit lines and connected to local input/output (I/O) line pairs.

The peripheral circuit region 20 includes clock terminals 21, address terminals 22, command terminals 23, and data terminals 24. The data terminals 24 may include data input/output terminals (DQ), data mask terminals (DM), a data strobe signal terminal DQS and its complementary signal terminal (/DQS). Input/output buffers 25 are connected to the DQ and DM, and DQS I/O buffers 26 are connected to the DQS and /DQS for read and write accesses of memories. The data access between the I/O buffer 25 and the memory cell array 12 may be executed by a data control circuit 27 through a first-in first-out (FIFO) 28, therefore the data is transferred between the FIFO 28 and the I/O buffer 25. The data control circuit 27 may also control a control circuit for DQS 29 via the FIFO 28 so that the DQS I/O buffer 26 can be controlled by the control circuit for DQS 29.

The address terminals 22 are supplied with command address signals CA0 to CA5, bank address signals such as BA0 and BA1, bank group address signals such as BG0, BG1, or the like, externally. Among the signals from the address terminals 22, row address signals obtained from the command address signals CA0 to CA5, the bank address signals and the bank address group signals can be supplied to the row decoder 13 via a row address buffer 33 for selecting a row of a bank. The row address buffer 33 may include a refresh counter. Column address signals obtained from the command address signals CA0 to CA5 from the address terminals 22 can also be supplied to the column decoder 14 via a column address buffer 34. The column address buffer 34 may include a burst counter.

The command terminals 23 may include a chip select (CS) pin 231 for receiving a complementary CS signal, a reset (RESET_N) pin 232, and the like.

A command decoder 30 decodes command signals from the command terminals 23 and command address signals from the address terminals 22 to receive various commands including a read command and a write command, and provides control signals responsive to the received commands to a global control logic 31. The address information from the address terminals 22 may be provided to the row address buffer 33 and the column address buffer 34 via the command decoder 30 and the global control logic 31. The functionality of the command decoder 30 will be described in more detail later in the present disclosure.

Accordingly, read data is read from a memory cell in the memory cell array 12 designated by a row address and a column address, when the read command is issued and the row address and the column address are timely supplied with the read command. The read data DQ is output from the data terminals 24 via the data controller 27, the FIFO 28 and the I/O buffer 26. Similarly, write data DQ is supplied to the data terminals 24 via the I/O buffer 26, the FIFO 28, and the data controller 27 to the memory cell array 12 and is written to the memory cell designated by a row address and a column address when the write command is issued and the row address and the column address are timely supplied with the write command.

The clock terminals 21 include clock pins CK 211 and /CK 212 and a clock enable (CKE) pin 213. The clock terminals 21 are supplied with external clock signals CK and /CK at the CK pin 211 and /CK pin 212, respectively. A clock enable (CKE) signal is supplied at the CKE pin 213 of the clock terminals 21. The CKE signal may activate or deactivate internal clock circuits, input buffers and output drivers, thus the CKE signal is part of a command. The external clock signals CK and /CK are complementary to each other and are supplied to a clock generator 13. The clock generator 13 receives the external clock signals CK and /CK and may execute phase control and generates an internal clock signal based on the received external clock signals and the CKE signal. Although not limited thereto, a DLL circuit can be used as the clock generator 13. The internal clock signal may be supplied various circuits, including the command decoder 30, the column decoder 14, the data controller 27, the FIFO 28, or the like. The various circuits may use the internal clock signal as a timing signal.

Figure 2:
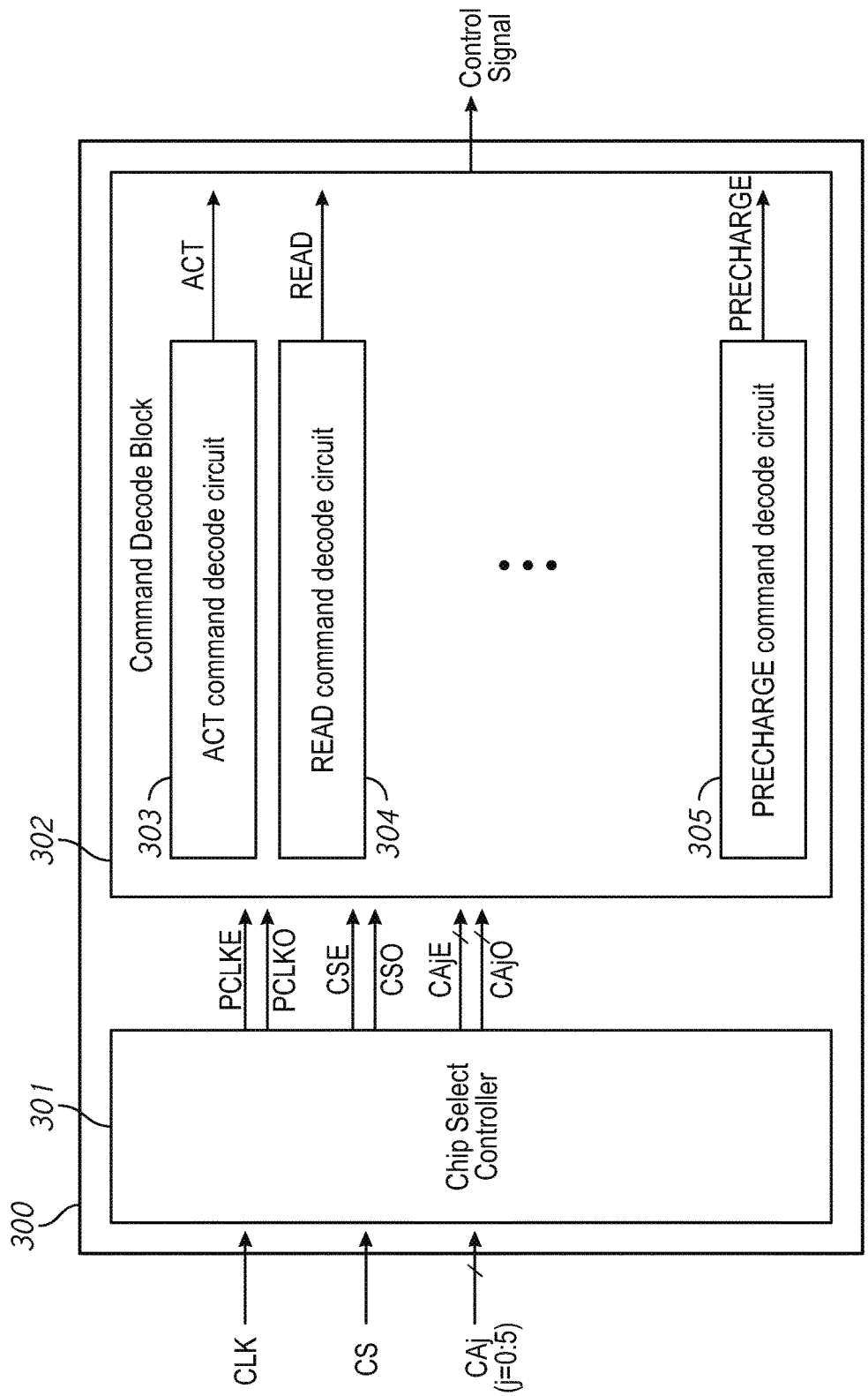
FIG. 2 is a schematic diagram of an example of a command decoder in accordance with the present disclosure.

FIG. 2 is a schematic diagram of an example of a command decoder in accordance with the present disclosure. A command decoder 300 may be used for the command decoder 30 in FIG. 1. The command decoder 300 includes a chip select controller 301 and a command decode block 302. The chip select controller 301 receives a clock signal, a chip select signal and a plurality of command address signals CAj (j: 0 to 5). The chip select controller 301 provides internal clock signals PCLKE and PCLKO having an even phase and an odd phase, respectively. The internal clock signals PCLKE and PCLKO are complementary signals having an internal clock cycle twice as long as a clock cycle of the external clock signal CLK (e.g., CK and /CK in FIG. 1). The chip select controller 301 also provides internal chip select signals, such as an even chip select signal CSE and an odd chip select signal CSO based on the corresponding internal clock signals PCLKE and PCLKO from the chip select signal. The chip select controller 301 further provides even command address signals CAjE and odd command address signals CAjO based on the corresponding internal clock signals PCLKE and PCLKO from the command address signals CAj. The command decoder 300 further includes a command decode block 302. The command decode block 302 may include various command decode circuits which decode various commands and issue the decoded commands. For example, the various command decode circuits may include, but not limited to, an ACT command decode circuit 303 which decodes an ACT command for activating a bank and a row of the bank and provides an internal activation signal ACT, a READ command decode circuit 304 which decodes a READ command for a memory read operation and provides an internal command signal READ, a PRECHARGE command decode circuit 305 which decodes a PRECHARGE command for a precharge operation and provides an internal command signal PRECHARGE. The command decoder 300 provides a control signal based on the decoded commands issued by the command decode block 302.

FIG. 3 is a command truth table of various combinations of command signals for command operations for a semiconductor device, according to one embodiment of the present disclosure. For example, a command decoder in the semiconductor device receives the combination of command signals including a clock enable (CKE) signal, a chip select (CS) signal and command address signals CAj (j: 0 to 5). In FIG. 3, numbers "1", "2", "3", and "4" in a CK Edge field corresponds to a first clock cycle, a second clock cycle, a third clock cycle and a fourth clock cycle of each command, respectively. In the command truth table, "v" represents that a corresponding bit can be either "H" or "L" which is a defined logic level. A bit "x" represents a "Don't Care" and any of the clock enable signal, the chip select signal and the command address signals CA[5:0] represented by "x" can be floated. MA[5:0] represent mode register address operands for selecting one of a plurality of mode registers and OP[7:0] represents operands to be written. BA[2:0] represent bank addresses, R[15:0] represent row addresses, and C[9:2] represent column addresses. The lower two column addresses (C0-C1) may be assumed to be "zero" and are not transmitted on the CA bus. An AB bit indicates whether the command is applied to all banks. An AP bit represents whether an auto-precharge occurs to a bank associated with a command including the AP bit. A BL bit indicates a burst-length mode. As will be described in more detail below, the semiconductor apparatus according to the present disclosure may typically include commands of predetermined clock cycles, four clock cycles as an example, though a number of clock cycles for commands may not be limited to four clock cycles.

As shown in FIG. 3, the CKE signal is active (e.g., "H") while a command is being provided. The CS signal is active (e.g., "H") in the first clock cycle of the command when a clock (CK) edge is "1", except for a "DESELECT" command for turning off operations. The active CS signal indicates that a current clock cycle is the first clock cycle of the command. Once the command decoder detects the active CS signal, the command decoder may also receive a portion of the command at the first and second clock cycles of the clock signal. The received portion of the command at the first clock cycle may include a command code represented by at least a portion of CA0 to CA5 having a unique combination of logic values for identifying a command type. For example, an "ACT" command for an activation of a row address of a bank may include a command code having a combination of CA0 and CA1 as "HL". A "READ" command for a read operation of data from a memory cell may include a command code having a combination of CA0 to CA4 as "LHLLL". A "WRT" command for a write operation of data to a memory cell may include a command code which is a combination of CA0 to CA4 as "LLHLL". A "MRR" command for a read operation of a mode register may include a combination of CA0 to CA4 "LHHHL" as a command code. A "MRW" command for a write operation of the mode register may include a command code having a combination of CA0 to CA4 as "LHHLL". A command code of "PRECHARGE" for a precharge operation may include a combination of CA0 to CA4 "HHHLH" as a command code, etc. In this example, unlike dividing a command into two two-cycle sub commands that requires a unique command code for each two-cycle sub command, the command code of fewer variations using fewer CA bits can be transmitted in four clock cycles.

In the command truth table of FIG. 3, the third clock cycle of the four-cycle command includes the CS signal representing a first state, namely inactive (e.g., "L"). The active CS signal indicates that the command decoder continues to receive the remaining portion of the command at the third clock cycle and a fourth clock cycle of the clock signal. In this manner, the command can be completely received by the semiconductor device by the fourth clock cycle. In contrast, if the third clock cycle of the four-cycle command includes the CS signal representing a second state, namely active (e.g., "H"), the command decoder again considers the third clock cycle of the clock signal as the first clock cycle of a new command rather than the third clock cycle of the command. Thus, with the CS signal active during the third clock cycle of the clock signal, the command decoder may invalidate the portion of the command received at the first and second clock cycles of the clock signal and may further prepare for receiving a new command, so that the new command can be input to the semiconductor device. In summary, the command decoder may continue to accept the command if the CS signal is inactive (e.g., "L") at the third clock cycle whereas the command decoder may accept the new command if CS signal is active (e.g., "H") is at the third clock cycle.

Figure 4A:
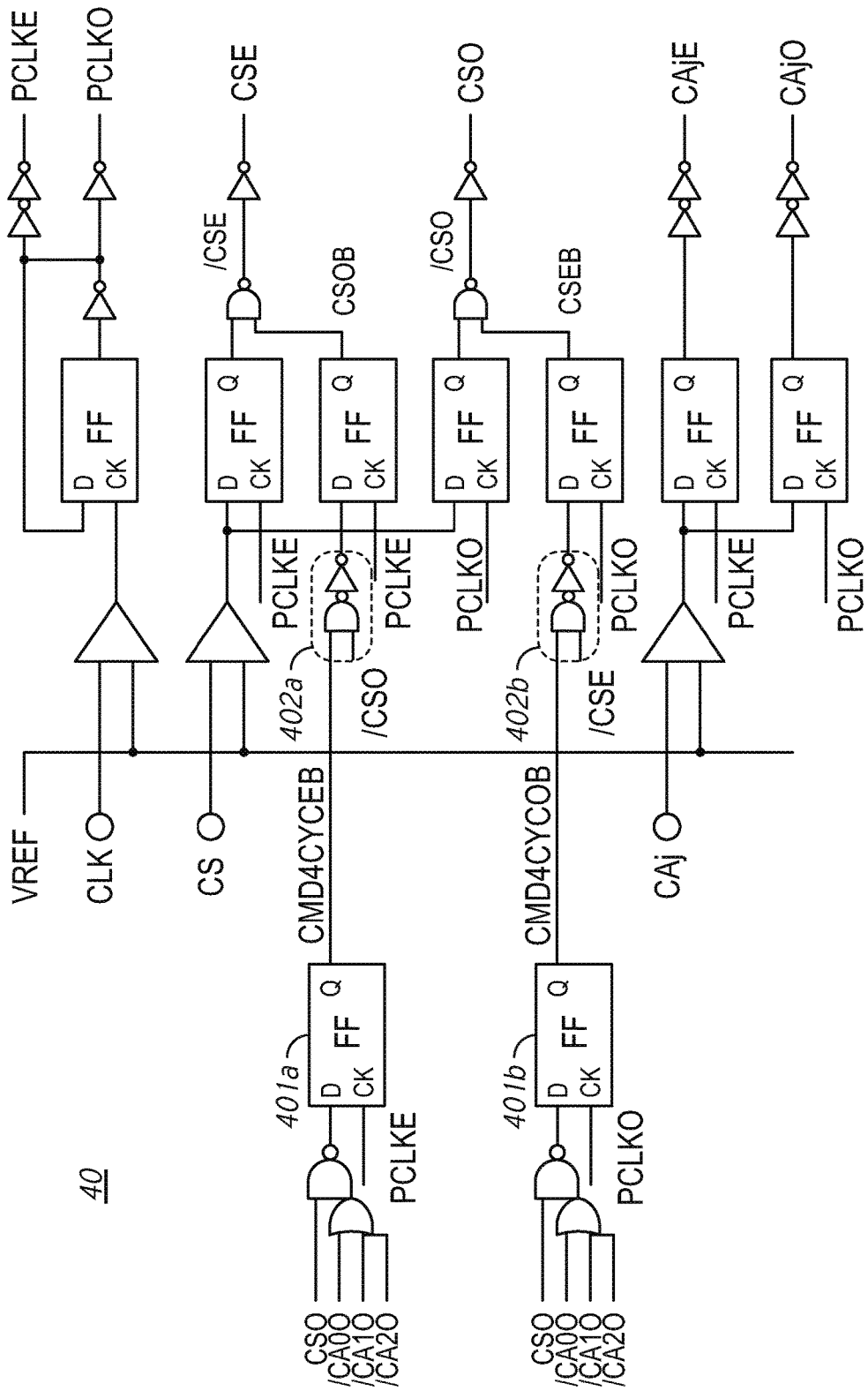
FIG. 4A is a circuit diagram of a chip select controller according to an embodiment of this present disclosure.

FIG. 4A is a circuit diagram of a chip select controller 40 according to an embodiment of this present disclosure. The chip select controller 40 shown in FIG. 4A may be used as the chip select controller 301 of FIG. 2. The chip select controller 40 receives a chip select (CS) signal, command address signals CAj (j: 0 to 5) and a clock (CLK) signal and provides even and odd chip select signals CSO and CSE, even and odd command address signals CAjE and CAjO and even and odd internal clock signals PCLKE and PCLKO. Using the even and odd internal clock signals PCLKE and PCLKO, the command decoder may receive a command at either an even edge or an odd edge and may further ignore the CS signal of a next odd edge or a next even edge, respectively. The chip select controller 40 includes latch circuits 401a and 401b that holds a signal for a predetermined time (e.g., one odd/even clock cycle corresponding to two clock cycles of the external clock signal) for receiving commands of the predetermined clock cycles (e.g., four clock cycles) shown in FIG. 3. The latch circuits 401a and 401b receive the odd and even chip select signals CSO and CSE, in addition to the odd and even command address signals for CA0 to CA2. Each of the latch circuits 401a and 401b provides a hold signal that is used for disabling a chip select signal for a predetermined time. In this embodiment, the predetermined time is one odd/even clock cycle corresponding to two clock cycles in order to ignore the CS signal at the fourth clock cycle. The OR circuits 402a and 402b receive the hold signals CMD4CYCEB and CMD4CYCOB from the latch circuits 401a and 401b as well as complementary CS signals /CSO and /CSE which are complementary to the chip select signals CSO and CSE, respectively. The OR circuits 402a and 402b provide signals for latch circuits that provide four-cycle CS disable signals CSOB and CSEB for disabling CS signals CSE and CSO of the second and fourth clock cycles based on the corresponding internal clock signals PCLKE and PCLKO, respectively. Thus, the chip select controller provides odd and even CS signals CSE and CSO for accepting four-cycle commands.

Figure 4B:
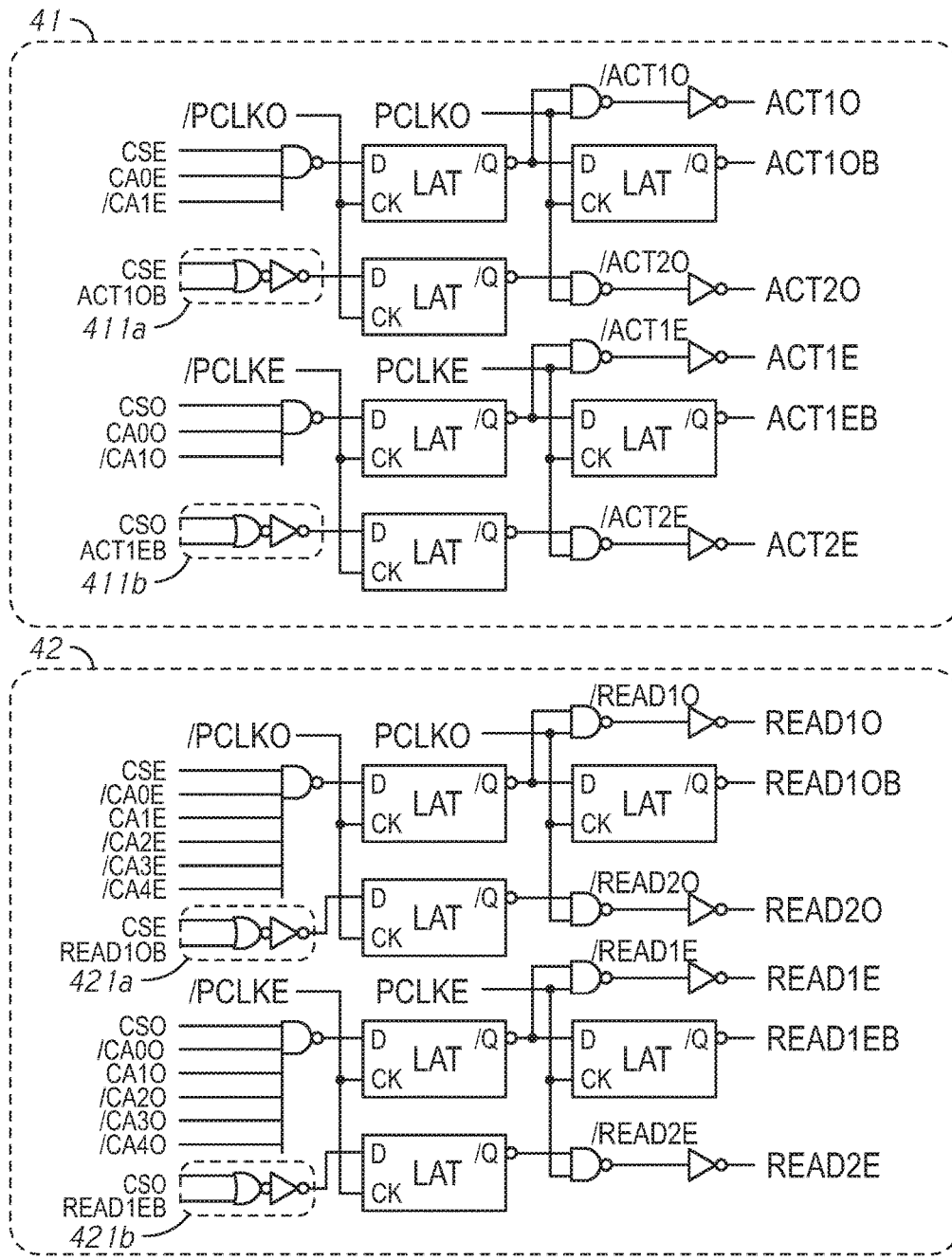
FIG. 4B is a circuit diagram of command decode circuits according to an embodiment of this present disclosure.

FIG. 4B is a circuit diagram of command decode circuits according to an embodiment of this present disclosure. An ACT command decode circuit 41 and a READ command decode circuit 42 are shown in FIG. 4B. The ACT command decode circuit 41 and a READ command decode circuit 42 may be used as the ACT command decode circuit 303 and the READ command decode circuit 304 of FIG. 2.

The ACT command decode circuit 41 includes logic circuits 411a and 411b which receive latched signals ACT1OB and ACT1EB as well as current CS signals CSE and CSO provided from the chip select controller 301 of FIG. 2, respectively. The latched signals ACT1OB and ACT1EB are generated from a combination of a chip select (CS) signal and command address signals CA0 and CA1 of two clock cycles before a current clock cycle for each phase. The latched signals ACT1OB and ACT1EB signals are used for determining whether the signals of two clock cycles before is a portion of the first clock cycle of the ACT command. For example, once the first clock cycle is validated, the ACT command decode circuit 41 can determine whether a command received at an odd phase is acceptable, by checking whether the current CS signal CSO in the third clock cycle of the command indicates a first state being inactive (e.g., "L"). If the CS signal is inactive, the ACT command decode circuit 41 determines that the command is acceptable and validates the portion of the command already received at the first and second clock cycles. The ACT command decode circuit 41 provides an ACT2E signal, based on the ACT1EB signal and the current CS signal CSO in the third clock cycle. The ACT command decode circuit 41 further continues to receive the remaining portion of the command at the third clock cycle and a fourth clock cycle. Once the command is completely received by the fourth clock cycle, the ACT command decode circuit 41 issues the "ACT" command and the command decoder 300 provides a control signal responsive to the "ACT" command for an activation operation for designated a bank and a row of the bank. Similarly, the ACT command decode circuit 41 can determine whether a command received at an even phase is acceptable, and provides an ACT2O signal, based on the ACT1OB signal and the current CS signal CSE in the third clock cycle, if acceptable.

Similarly, The READ command decode circuit 42 includes logic circuits 421a and 421b which receive the latched signals ACT1OB and ACT1EB as well as current CS signals CSE and CSO respectively. If the CS signal is inactive, the READ command decode circuit 42 determines that the command is acceptable and validates the portion of the command already received at the first and second clock cycles of the clock signal The READ command decode circuit 42 further provides READ2O and READ2E signals, based on the ACT1OB and ACT1EB signals and the current CS signals CSE and CSO in the third clock cycle, respectively. The READ command decode circuit 42 further continues to receive the remaining portion of the command at the third clock cycle and a fourth clock cycle. Once the command is completely received by the fourth clock cycle, the READ command decode circuit 42 issues the "READ" command and the command decoder 300 provides a control signal for an activating operation for designated a bank and a row of the bank.

Figure 5:
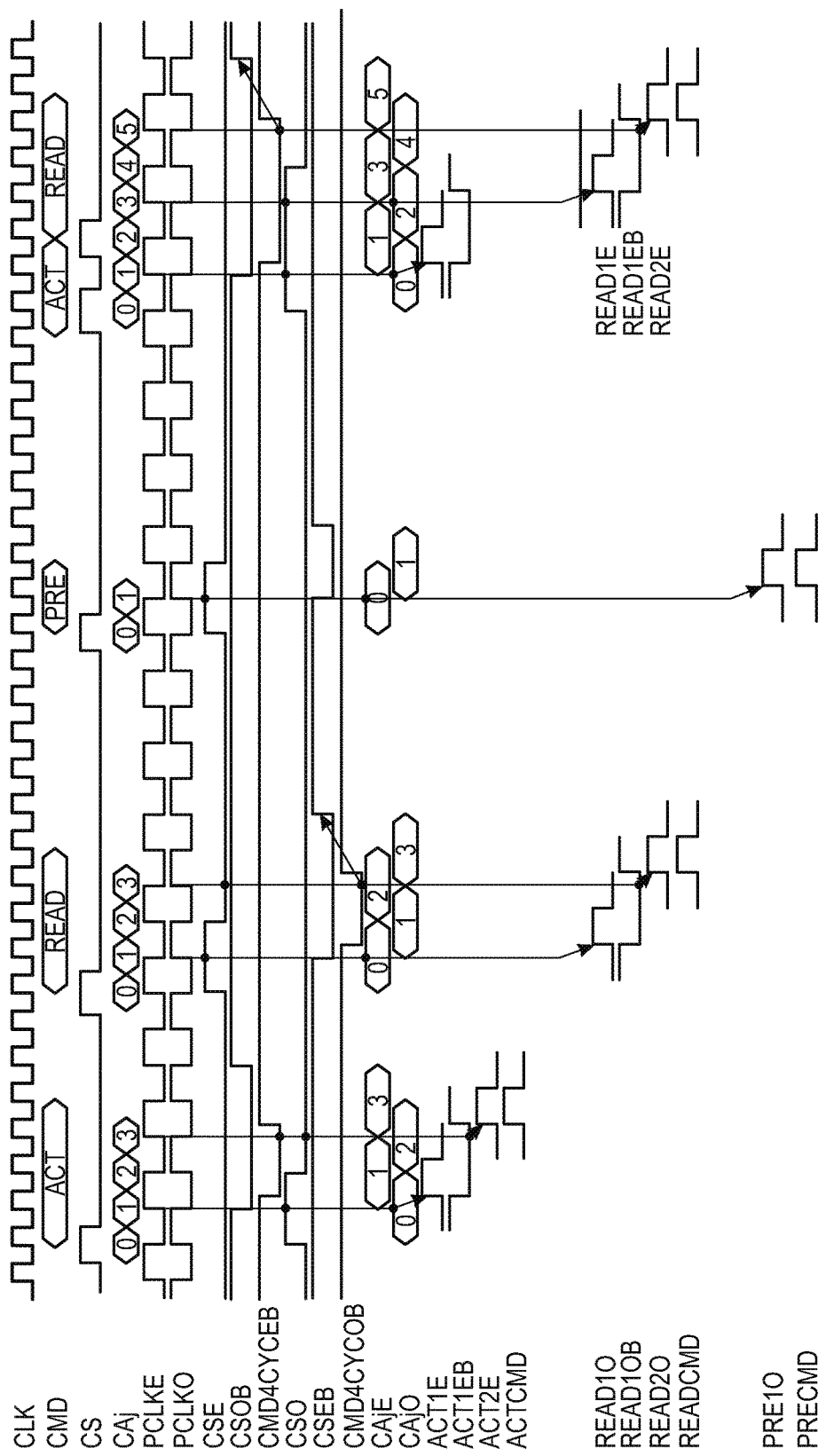
FIG. 5 is a timing diagram of command signals for command operations for a semiconductor device, according to an embodiment of the present disclosure.

FIG. 5 is a timing diagram of command signals for command operations for a semiconductor device, according to an embodiment of the present disclosure. For a timeline of CAj, numbers "0", "1", "2", and "3" correspond to the first clock cycle, a second clock cycle, a third clock cycle and a fourth clock cycle, respectively. The timing diagram of FIG. 5 corresponds to the circuit diagrams of FIGS. 4A and 4B and showing command signals behaviors when a command decoder receives an ACT command, a READ command, a PRE command, and a sequence of an ACT command followed by the READ commands. For example, while the ACT command is being received, an odd chip select signal CSO is activated and an ACT1E signal and its latched complementary signal ACT1EB are provided. A hold signal CMD4CYCEB is activated in response to the odd chip select signal CSO and odd command signals CAjO, and an odd CS disable signal CSOB is provided to disable an even chip select signal CSE based on an even internal clock signal PCLKE. Based on the odd chip select signal CSO, and the latched complementary signal ACT1EB held by the hold signal CMD4CYCEB, an ACT2E signal is activated which results in issuing the ACT command at a timing shown by an ACTCMD signal in FIG. 5. Similarly, while the READ command is being received the even chip select signal CSE is activated and a READ1O signal and its latched complementary signal READ1OB are provided. A hold signal CMD4CYCOB is activated in response to the even chip select signal CSE and even command signals CAjE, and the even CS disable signal CSEB is provided to disable the odd chip select signal CSO based on an odd internal clock signal PCLKO. Based on the even chip select signal CSE, and the latched complementary signal READ1OB held by the hold signal CMD4CYCOB, an READ2O signal is activated which results in issuing the READ command at a timing shown by a READCMD signal in FIG. 5. In case of receiving the PRE command, because the PRE command is a two-cycle command, the PRE command can be received without a hold signal for four-cycle command, thus the odd chip select signal CSO is activated and a PRE1O is read, consequently the PRE command is issued at a timing shown by a PRECMD signal.

In case of receiving the ACT command followed by the READ command, for example, a CSO signal becomes active responsive to a CS signal in the chip select controller 40 of FIG. 4A. The latch circuit 401a inside the chip select controller 40 receives complementary signals/CA0O, /CA1O and /CA2O and an odd CS signal CSO and provides a hold signal CMD4CYCEB that disables the CSE signal of the fourth clock cycle. The OR circuit 402a receives the hold signal CMD4CYCEB and a complementary signal of CSO and provides a CS disable signal CSOB which disables the even CS signal CSE until the fourth clock cycle. However, the odd CS signal CSO is kept active based on the CS signal being active again in the third clock cycle. This active CSO signal disables issuing the ACT command by not providing an ACT2E signal.

FIG. 6 is a command truth table of various combinations of command signals for a semiconductor device, according to an embodiment of the present disclosure. In this command table, the same definitions as of FIG. 3 are given to clock edges and bit representations with "v" and "x". As will be described in more detail below, the semiconductor apparatus according to the present disclosure may typically have commands of four clock cycles as an example, though a number of clock cycles for commands may not be limited to four clock cycles. In FIG. 6, the received portion of the command at the first clock cycle includes a command code represented by at least a portion of CA0 to CA5 having a unique combination of logic values different from the combination of FIG. 3 for identifying a command type. For example, a "READ" command for a read operation of data from a memory cell may include a command code having a combination of CA0 to CA2 as "LHL". A "WRT" command for a write operation of data to a memory cell may include a command code which is a combination of CA0 to CA2 as "LLH". A "MRR" command for a read operation of a mode register may include a combination of CA0 to CA2 as a command code "LHH". A "MRW" command for a write operation of the mode register may include a command code having a combination of CA0 to CA4 as "HHLLL". In the command truth table of FIG. 6, the third clock cycle of the four-cycle "ACT" command may allow either an inactive state (e.g., "L") or an active state (e.g., "H") of the CS signal in the third clock cycle when the CK edge is either "3" or "3". If the CS signal is "H" in the third clock cycle, the command address signal CA0 of the ACT command may indicate a predetermined logic value (e.g., "L") which corresponds to the command address signal CA0 of the first clock cycle of next command, such as the "WRT" command, "READ" command or the "MRR" command. Because these commands use three bits of the command address signals CA0-CA2 to convey their command codes in the first clock cycle without using any bit in the second clock cycle, it is possible to accommodate the first clock cycle and the second clock cycle of the "WRT", "READ" or "MRR" commands on the third clock cycle and the fourth clock cycle of the ACT command simultaneously.

Figure 7:
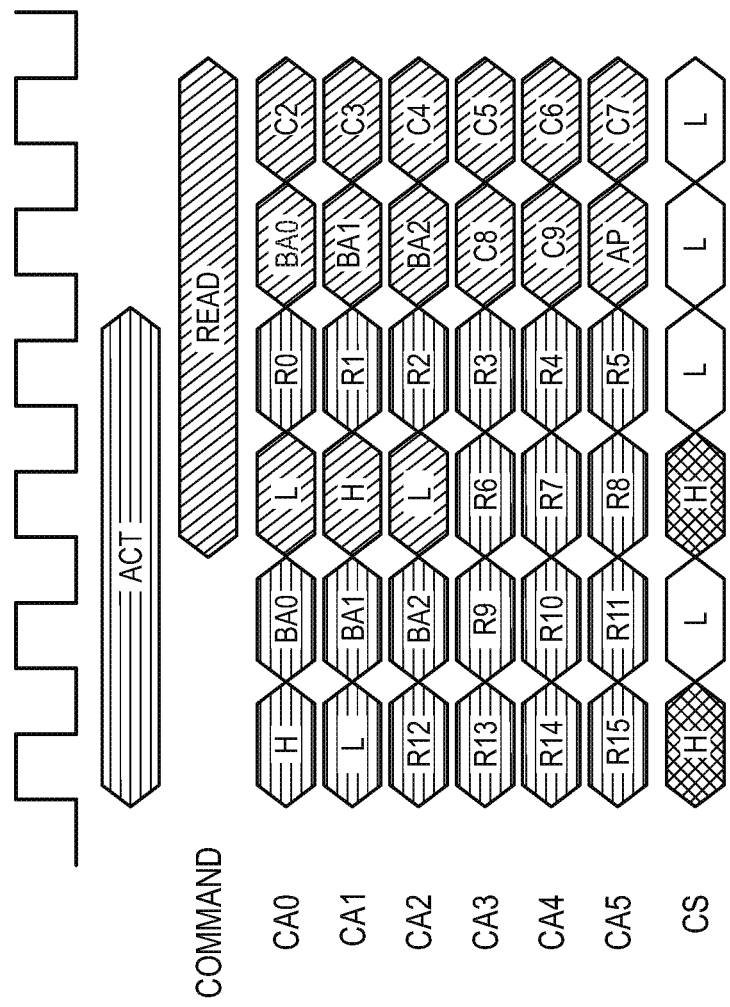
FIG. 7 is a diagram of command signals for a first command and a second command according to an embodiment of the present disclosure.

FIG. 7 is a diagram of command signals for a first command and a second command according to an embodiment of the present disclosure. An example in FIG. 7 shows the command signals such as a chip select (CS) signal and command address signals CA0 to CA5, where the first command is the ACT command and the second command is the READ command, however a combination of the first and second commands are not limited to the ACT command and the READ command. As shown in FIG. 6, the ACT command allows the value "L" for CA0 without using the command address signals CA1 and CA2, while using the command address signals CA3 to CA5 for row address bits R6 to R8 when the chip select signal CS is active (e.g., "H") in the third clock cycle. Therefore, the first clock cycle of the READ command having a first portion of the READ command, such as a command code "LHL" conveyed on the command address signals CA0 to CA2 is acceptable without conflicting the third clock cycle of the ACT command. In the fourth clock cycle of the ACT command, the ACT command uses the command address signals CA0 to CA5 to convey row address bits R0 to R5 whereas the READ command does not use bits in the second clock cycle. As described above, a second portion of the first command such as a portion of row address bits of the ACT command and the first portion of the second command such as the READ command can be conveyed simultaneously. Thus, the first command such as the ACT command and the second command such as the READ command can be transmitted in six clock cycles by sharing two clock cycles. The partial clock cycle sharing allows simultaneous transmission of a second portion of the first command and a first portion of the second command at another clock cycle than the first clock cycle (e.g., the third clock cycle and the fourth clock cycle) of first predetermined clock cycles for the first command transmission and thus reduces the number of clock cycles used for transmitting two commands.

Figure 8:
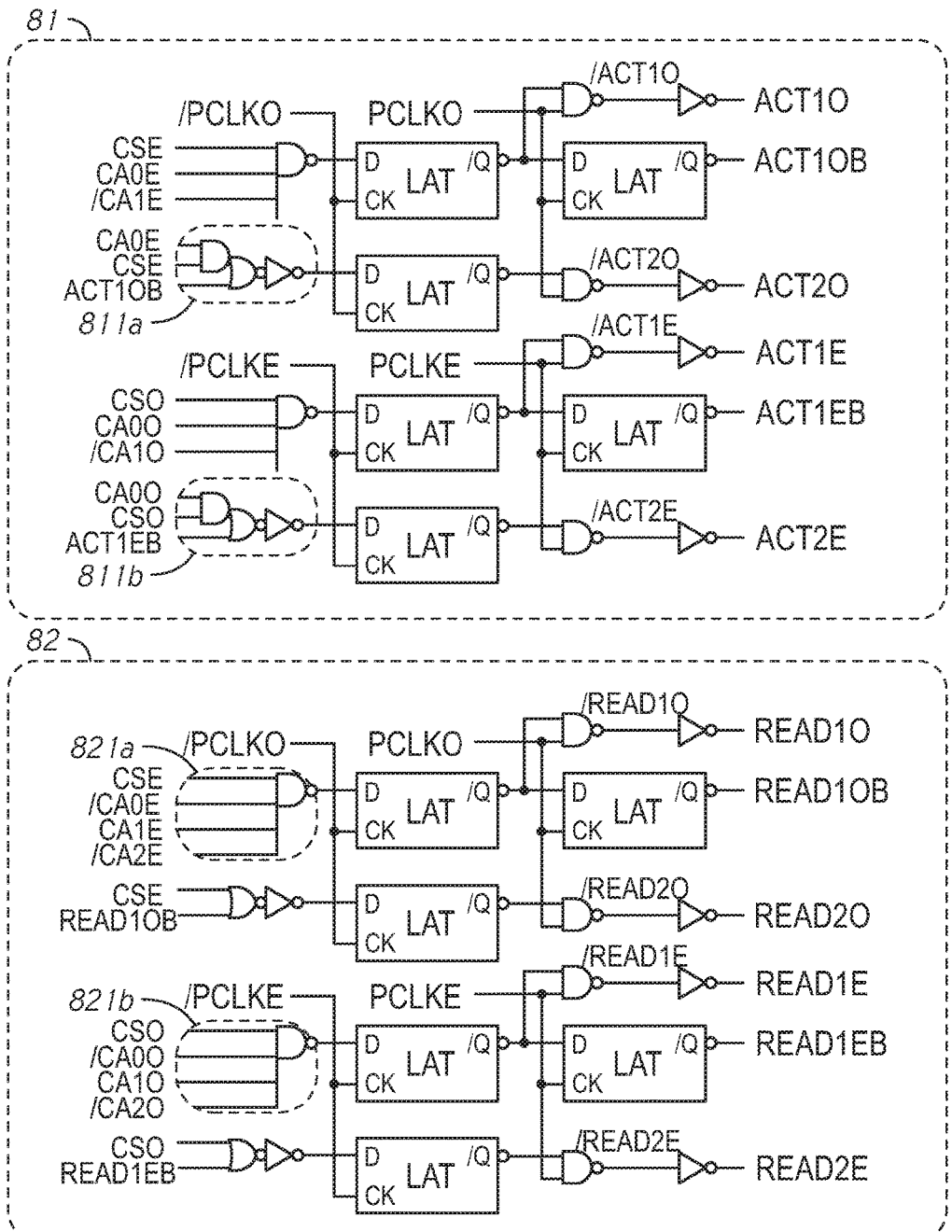
FIG. 8 is a circuit diagram of command decode circuits according to an embodiment of this present disclosure.

FIG. 8 is a circuit diagram of command decode circuits according to an embodiment of this present disclosure. An ACT command decode circuit 81 and a READ command decode circuit 82 shown in FIG. 8 are merely examples, and any other circuit that provides similar functionality may be used as the ACT command decode circuit 303 and the READ command decode circuit 304 of FIG. 2. The ACT command decode circuit 81 includes logic circuits 811*a* and 811*b* which receive CA0E and CA0O, latched signals ACT1OB and ACT1EB and the current CS signals CSE and CSO, respectively. The ACT command decode circuit 81 detects the status of the command address signal CA0 being a predetermined logic value (e.g., "L") as a condition for accepting the first command, such as the ACT command, while simultaneously receiving the first clock cycle of the second command at the third clock cycle of the first command. Thus, either the CS signal being "L" or CA0 signal being "L" in the third clock cycle of the first command can be a trigger to issue the first command. The READ command decode circuit 82 includes logic circuits 821*a* and 821*b* which receive three corresponding even or odd command address signals in addition to their corresponding even/odd chip select signals, because the command code for the READ command uses three command address signals CA0-CA2.

Figure 9:
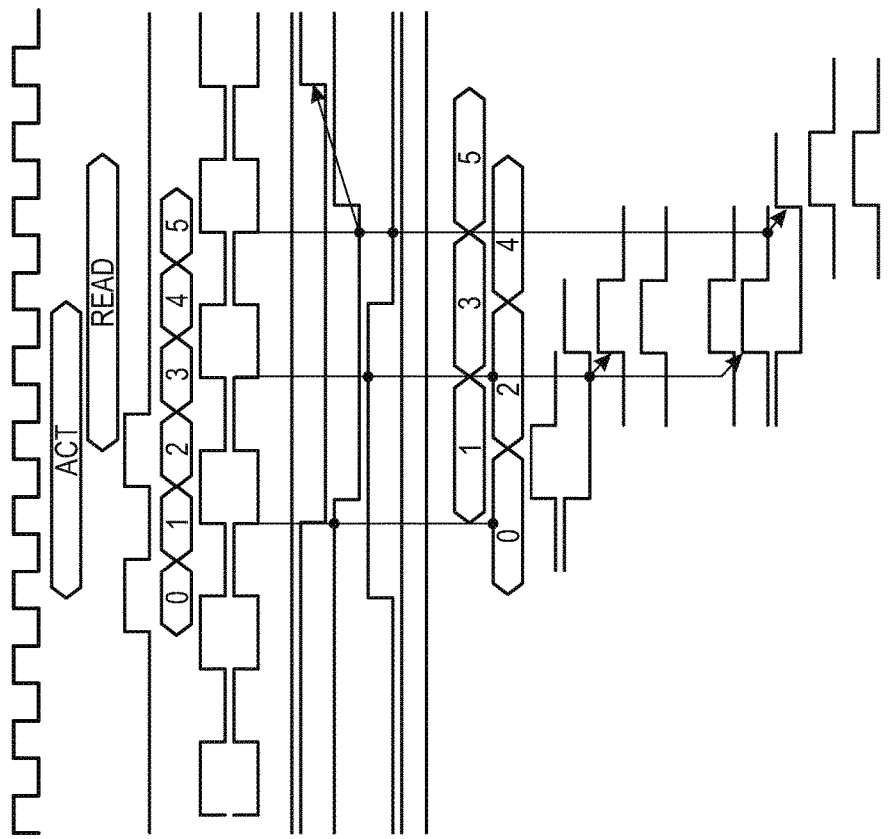
FIG. 9 is a timing diagram of command signals for decoding commands for a semiconductor device, according to an embodiment of the present disclosure.

FIG. 9 is a timing diagram of command signals for decoding commands for a semiconductor device, according to an embodiment of the present disclosure. The timing diagram of FIG. 9 corresponds to the circuit diagram of FIG. 8. For example, the logic circuit 811*b* receives a command address signal CA0O for CA0, a latched signal ACT1EB and a current CS signal CSO, while receiving an ACT command as the first command and a READ command as the second command. The ACT command decode circuit detects the status of the command address signal CA0O being "L" as a condition for activating ACT2E indicating accepting the first command, such as the ACT command, while simultaneously receiving the first clock cycle of the second command at the third clock cycle of the first command. Thus, CA0O signal being "L" in the third clock cycle of the first command can be a trigger to issue the first command.

FIG. 10 is a command truth table of various combinations of command signals for a semiconductor device, according to an embodiment of the present disclosure. In this command table, the same definitions as of FIG. 3 are given to clock edges and bit representations with "v", "x", and the like. As will be described in more detail below, the semiconductor apparatus according to the present disclosure may typically have commands of four clock cycles as an example, though a number of clock cycles for commands may not be limited to four clock cycles. In FIG. 10, the received portion of the command at the first clock cycle includes a command code represented by at least a portion of CA0 to CA5 having a unique combination of logic values different from the combinations of FIGS. 3 and 6 for identifying a command type. For example, a "MRR" command for a read operation of a mode register may include a combination of CA0 to CA4 "HHLHL" as a command code. A "PRECHARGE" command for a precharge operation may include a command code having a combination of CA0 to CA2 as "LHH" and the "PRECHARGE" command can be transmitted in four clock cycles. In the command truth table of FIG. 10, the third clock cycle of the four-clock cycle "PRECHARGE" command may allow either an inactive state (e.g., "L") or an active state (e.g., "H") of the chip select signal CS when the CK edge is "3" or "3'". If the chip select signal CS is "H" in the third clock cycle, the command address signal CA0 of the PRECHARGE command may indicate a predetermined logic value of "L" which corresponds to the command address signal CA0 of the first clock cycle of a next command, such as the "WRT" command or "READ" command. Because these commands use three bits of the command address signals CA0-CA2 to convey their command codes in the first clock cycle without using any bit in the second clock cycle, it is possible to accommodate the first clock cycle and the second clock cycle of the "WRT" or "READ" commands on the third clock cycle and the fourth clock cycle of the PRECHARGE command simultaneously.

Figure 11:
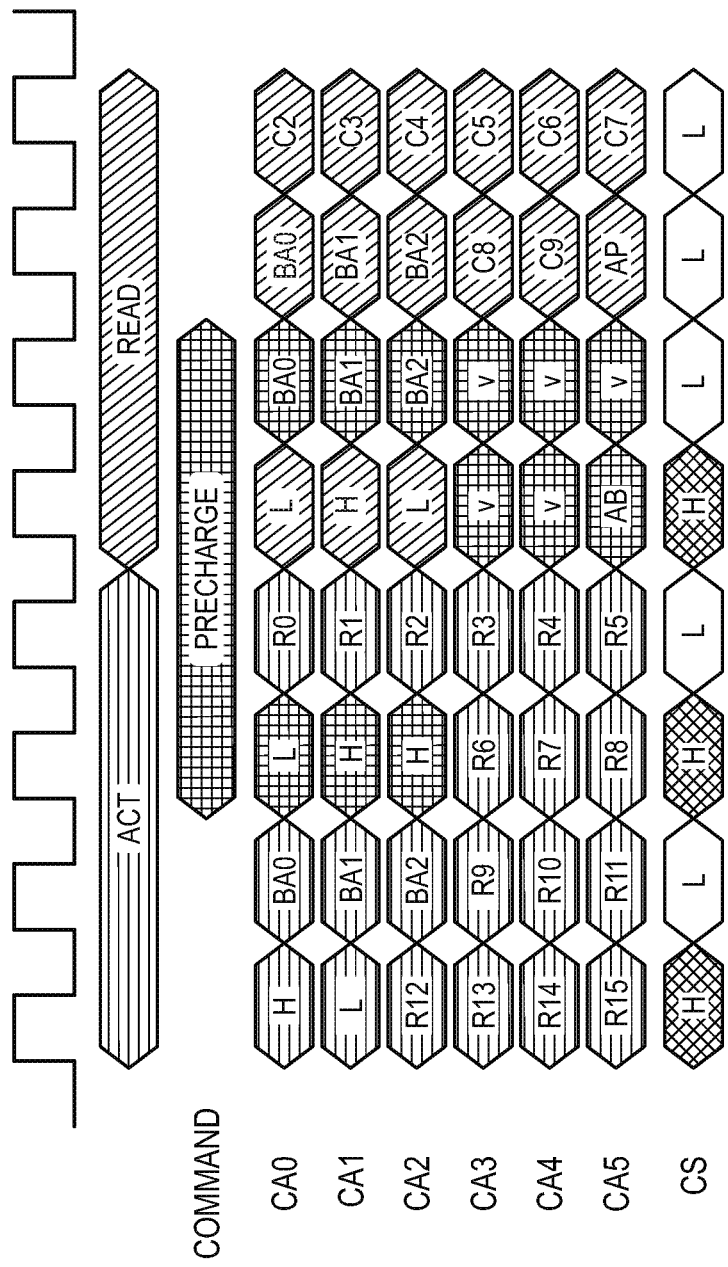
FIG. 11 is a diagram of command signals for a first command, a second command, and a third command according to an embodiment of the present disclosure.

FIG. 11 is a diagram of command signals for a first command, a second command, and a third command according to an embodiment of the present disclosure. The command signals included in FIG. 11 are the chip select signal CS and the command address signals are CA0 to CA5. In this example, the first command is the ACT command, the second command is the PRECHARGE command and the third command is the READ command.

As shown in FIG. 11, the ACT command allows the value "L" for CA0 without using the command address signals CA1 and CA2, while using the command address signals CA3 to CA5 for row address bits R6 to R8 when the chip select signal CS is active (e.g., "H") in the third clock cycle of the ACT command. Therefore, the first clock cycle of the PRECHARGE command having a first portion of the PRECHARGE command, such as a command code "LHH" conveyed on the command address signals CA0 to CA2 is acceptable without conflicting the third clock cycle of the ACT command. Similarly, the PRECHARGE command allows the value "L" for CA0 without using the command address signals CA1 and CA2, while using the command address signal CA5 for a BA bit which allows selection between precharging per bank or precharging all bank, when the chip select signal CS is active (e.g., "H") in the third clock cycle of the PRECHARGE command. Therefore, the first clock cycle of the READ command having a first portion of the READ command, such as a command code "LHL" using the command address signals CA0 to CA2, is acceptable without conflicting the third clock cycle of the PRECHARGE command. This allows simultaneous transmission of a second portion of the first command and a first portion of the second command at another clock cycle than the first clock cycle (e.g., the third clock cycle and the fourth clock cycle) of first predetermined clock cycles for the first command transmission, and simultaneous transmission of a second portion of the second command and a first portion of the third command at another clock cycle (e.g., the third clock cycle and the fourth clock cycle) of second predetermined clock cycles for the second command transmission. Thus, three commands, including the first command such as the ACT command, the second command such as the PRECHARGE command and the third command such as the READ command, can be transmitted in eight clock cycles. This type of partial clock cycle sharing reduces the number of clock cycles used for transmitting a plurality of consecutive commands.

Figure 12:
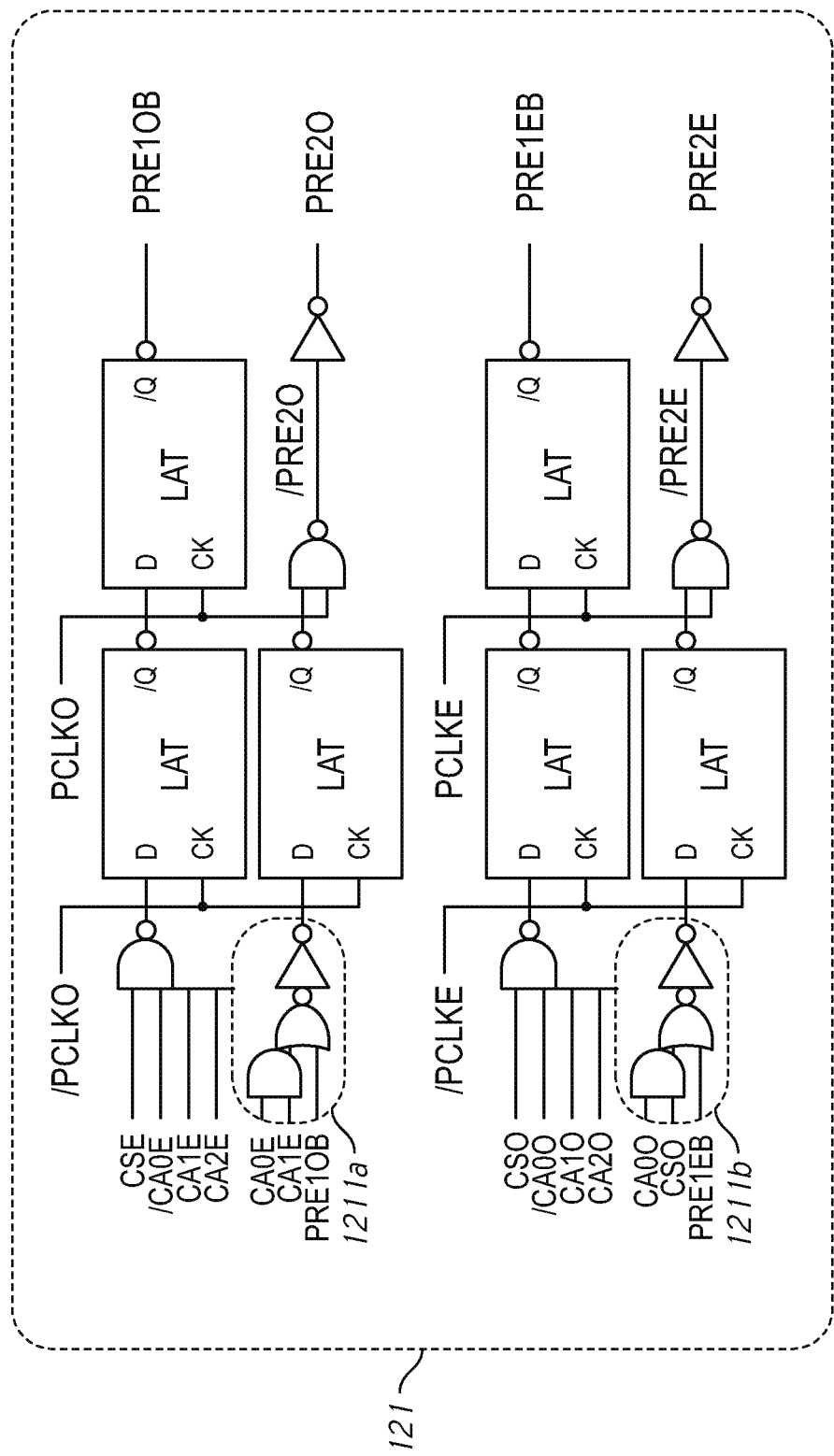
FIG. 12 is a circuit diagram of a command decode circuit according to an embodiment of this present disclosure.

FIG. 12 is a circuit diagram of a command decode circuit according to an embodiment of this present disclosure. A PRECHARGE command decode circuit 121 shown in FIG. 12 is merely an example, and any other circuit that provides similar functionality may be used as the PRECHARGE command decode circuit 305 of FIG. 2. The PRECHARGE command decode circuit 121 includes logic circuits 1211a and 1211b which receive CA0E and CA0O, latched signals PRE1OB and PRE1EB and the current CS signals CSE and CSO, respectively. The PRECHARGE command decode circuit 121 detects the status of the command address signal CA0 being "L" as a condition for accepting the second command, such as the PRECHARGE command, while simultaneously receiving the third command at the third clock cycle of the first command. Thus, either the CS signal being "L" or CA0 signal being "L" in the third clock cycle of the second command can be a trigger to issue the second command.

Figure 13:
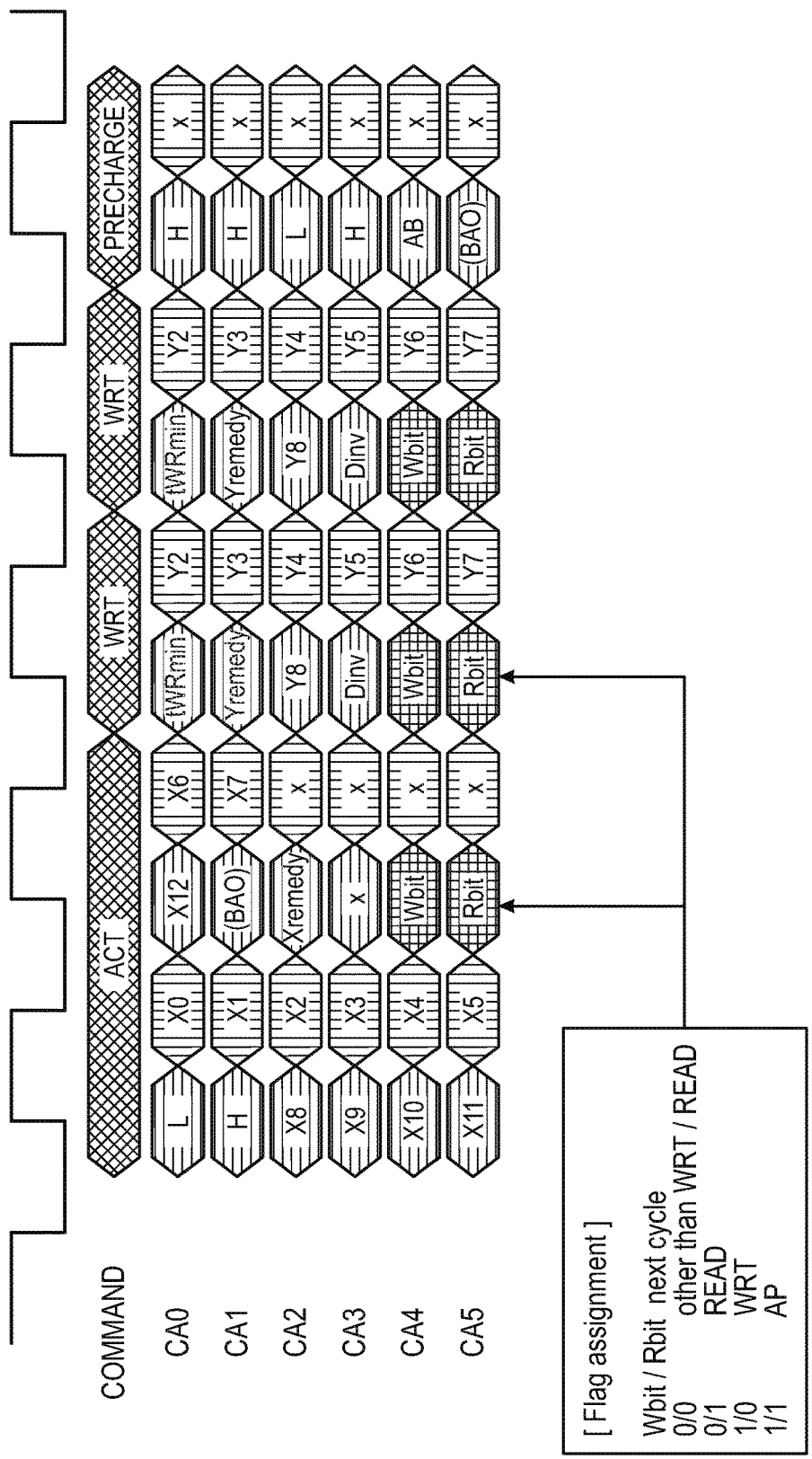
FIG. 13 is a diagram of command signals for a plurality of consecutive commands according to an embodiment of the present disclosure.

FIG. 13 is a diagram of command signals for a plurality of consecutive commands according to an embodiment of the present disclosure. In this embodiment, command address signals alternate according to a rising edge and a falling edge as the clock edges, for example. In FIG. 13, the command address signals are CA0 to CA5, where the first command is the ACT command, the second command and the third command are the WRT commands and the fourth command is the PRECHARGE command. As shown in FIG. 13, X[12:0] represent row addresses and Y[8:2] represent column addresses. A BA0 flag is used for 512p. A Xremedy flag and a Yremedy flag represent address control modes of X-address remedy and Y-address remedy for faulty word line/bit line replacement, respectively. A Dinv flag may be set to 0 when WR value is written and may be set to 1 when an inversion of WR value is written. A tWRmin flag may be set when TPWTWRT is used. An AB bit represents whether an auto-precharge occurs to a bank associated with a command including the AP bit.

Flags "Wbit" and "Rbit" are assigned to command address signals CA4 and CA5 at the third clock cycle of the ACT command. The flags "Wbit" and "Rbit" are command prediction information which predicts a type of next command. Thus, the command decoder can determine the type of the second command from these "Wbit" and "Rbit" flags. As a result, the second command may be able to use extra bits assigned for information other than a command code. For example, if the Wbit flag and the Rbit flag are both inactive (e.g., "L"), the next command is neither the READ command nor the WRT command. If the Wbit is active (e.g., "H") and Rbit is inactive, the next command is the WRT command. If the Wbit is inactive and Rbit is active, the next command is the READ command. If the Wbit and Rbit are both active, the next command is an auto-precharge command. Because bits conventionally assigned to a command code can be assigned to other information than the command code, the WRT command of FIG. 13 may be conveyed in two clock cycles instead of four clock cycles, even including command prediction information flags, such as the Wbit and Rbit flags for the next command in the first clock cycle of the WRT command.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. A method of computing a command operation for a semiconductor device comprising:
receiving a clock signal and a chip select signal;
providing an internal clock from the clock signal;
receiving, via a plurality of command address signals, a portion of a command at first and second clock cycles of a clock signal;
providing a hold signal based on the internal clock signal and the chip select signal by at least one latch circuit;
validating the portion of the command received at the first and second clock cycles of the clock signal at a third clock cycle of the clock signal when a chip select signal indicates a first state and continuing to receive, via the plurality of command address signals, a remaining portion of the command at the third clock cycle and a fourth clock cycle of the clock signal so that the command can be completely received by the semiconductor device by the fourth clock cycle;
decoding the portion of the command at the first and second clock cycles of the clock signal and the remaining portion of the command at the third and fourth clock cycles of the clock signal; and
invalidating the portion of the command received at the first and second clock cycles of the clock signal at the third clock cycle of the clock signal when the chip select signal indicates a second state different from the first state, so that a new command can be input to the semiconductor device at the third clock cycle of the clock signal.

2. The method of computing the command operation for the semiconductor device of claim 1, further comprising:
providing a hold signal based on the clock signal until the fourth clock cycle by at least one latch circuit; and
disabling the chip select signal on the second and fourth clock cycles based on the hold signal by at least one OR circuit.

3. The method of computing the command operation for the semiconductor device of claim 1, further comprising:
detecting whether the chip select signal is an inactive state, wherein the first state corresponds to the inactive state; and
validating the portion of the command received at the first and second clock cycles of the clock signal at the third clock cycle of the clock signal.

4. The method of computing the command operation for the semiconductor device of claim 1, further comprising:
detecting whether the chip select signal is an active state, wherein the second state corresponds to the active state; and
invalidating the portion of the command received at the first and second clock cycles of the clock signal at the third clock cycle of the clock signal.

5. The method of computing the command operation for the semiconductor device of claim 1, further comprising:
receiving an active clock enable (CKE) signal while the command is being received.

6. The method of computing the command operation for the semiconductor device of claim 1, further comprising:
during the first clock cycle, receiving a deselect command indicative of turning off the command operation.

7. The method of computing the command operation for the semiconductor device of claim 6, further comprising:
during the first clock cycle, receiving an inactive chip select signal.

8. The method of computing the command operation for the semiconductor device of claim 1, wherein the portion of the command and the remaining portion of the command correspond to a combination of logical values.

9. The method of computing the command operation for the semiconductor device of claim 8, wherein the combination of logical values represents at least one of an "ACT" command, a "READ" command, a "WRT" command, a "MRR" command, a "MRW" command", or a "PRE-CHARGE" command.

10. A method comprising:
receiving a clock signal and a chip select signal;
providing an internal clock from the clock signal;
receiving, via a plurality of command address signals, a portion of a command at first and second clock cycles of a clock signal;
providing a hold signal based on the internal clock signal and the chip select signal by at least one latch circuit;
determining, at a third clock cycle of the clock signal, whether to validate the portion of the command based partly on a state of a chip select signal;
at least during the third clock cycle, receiving, via the plurality of command address signals, a remaining portion of the command based on a determination to validate the portion of the command; and
decoding the portion of the command at the first and second clock cycles of the clock signal and the remaining portion of the command.

11. The method of claim 10, wherein, during the third clock cycle, the state of the chip select signal corresponds to an inactive state.

12. The method of claim 10, further comprising:
during at least the third clock cycle, invalidating the portion of the command received at the first and second clock cycles of the clock signal based on a determination to not validate the portion of the command.

13. The method of claim 12, wherein, during the third clock cycle, the state of the chip select signal corresponds to an active state.

14. The method of claim 10, further comprising:
during a fourth clock cycle, receiving the remaining portion of the command based on the determination to validate the portion of the command.

15. An apparatus comprising:
a clock generator configured to provide a clock signal;
a command decoder configured to decode a command on a plurality of command address signals, the command decoder further configured to receive the command on the plurality of command address signals, wherein the command decoder further comprises a chip select controller configured to receive a chip select signal, the plurality of command address signals, and the clock signal,
wherein the chip select controller comprises:
a frequency divider configured to provide an internal clock signal from the clock signal;
at least one latch circuit configured to provide a hold signal based on the internal clock signal and the chip select signal, and
wherein a portion of the command is received in first and second clock cycles of the clock signal.

16. The apparatus of claim 15, wherein the command decoder further comprises at least one command decode circuit configured to receive the chip select signal, the plurality of command address signals, and the internal clock signal from the chip select controller;
wherein the command decode circuit comprises at least one OR circuit configured to receive the chip select signal from the chip select controller and the portion of the command based partly on the chip select signal and a portion of the command address signals during the first and second clock cycles, and
wherein the command decode circuit is configured to determine whether the portion of the command is validated based partly on the chip select signal.

17. The apparatus of claim 16, wherein the at least one OR circuit is configured to receive the chip select signal from the chip select controller and a remaining portion of the command based partly on the chip select signal and a portion of the command address signals during third and fourth clock cycles of the clock signal.

18. The apparatus of claim 15, wherein the command comprises at least one of an "ACT" command, a "READ" command, a "WRT" command, a "MRR" command, a "MRW" command", or a "PRECHARGE" command.

* * * * *